US006828176B1

(12) United States Patent
Nemati et al.

(10) Patent No.: US 6,828,176 B1
(45) Date of Patent: Dec. 7, 2004

(54) THYRISTOR HAVING A FIRST EMITTER WITH RELATIVELY LIGHTLY DOPED PORTION TO THE BASE

(75) Inventors: Farid Nemati, Menlo Park, CA (US); Scott Robins, San Jose, CA (US); Andrew Horch, Sunnyvale, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/650,334

(22) Filed: Aug. 28, 2003

Related U.S. Application Data

(62) Division of application No. 10/253,363, filed on Sep. 24, 2002, now Pat. No. 6,703,646.

(51) Int. Cl.$^7$ ............................................. H01L 21/332
(52) U.S. Cl. .............................. 438/133; 257/E21.388; 257/E21.392
(58) Field of Search .......................... 438/133; 257/107, 257/E21.388, E21.392

(56) References Cited

U.S. PATENT DOCUMENTS

| 6,104,045 A | 8/2000 | Forbes et al. |
| 6,128,216 A | 10/2000 | Noble, Jr. et al. |
| 6,225,165 B1 | 5/2001 | Noble, Jr. et al. |
| 6,229,161 B1 | 5/2001 | Nemati et al. |
| 6,686,612 B1 * | 2/2004 | Horch et al. ................. 257/133 |

OTHER PUBLICATIONS

Kim, Dong Myong, Electrical Characteristics of NPN–AlGaAs/BaAs HBTs with Modulated Base Doping Structures, Journal of the Korean Physical Society, vol. 33, No. 5, Nov. 1998, pp 607–611.

* cited by examiner

Primary Examiner—George Fourson
Assistant Examiner—Thanh V Pham

(57) ABSTRACT

A thyristor-based semiconductor device exhibits a relatively increased base-emitter capacitance. According to an example embodiment of the present invention, a base region and an adjacent emitter region of a thyristor are doped such that the emitter region has a lightly-doped portion having a light dopant concentration, relative to the base region. In one embodiment, the thyristor is implemented in a memory circuit, wherein the emitter region is coupled to a reference voltage line and a control port is arranged for capacitively coupling to the thyristor for controlling current flow therein. In another implementation, the thyristor is formed on a buried insulator layer of a silicon-on-insulator (SOI) structure. With these approaches, current flow in the thyristor, e.g., for data storage therein, can be tightly controlled.

8 Claims, 6 Drawing Sheets

THYRISTOR HAVING A FIRST EMITTER WITH RELATIVELY LIGHTLY DOPED PORTION TO THE BASE

This is a divisional of application Ser. No. 10/253,363 filed Sep. 24, 2002, now U.S. Pat. No. 6,703,646 which is incorporated herein by reference.

FIELD OF THE INVENTION

The present invention is directed to semiconductor devices and, more specifically, to semiconductor devices having thyristor-based devices and to thyristor-based memory.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that capacitive coupling between a control port and a thyristor base region can substantially modulate the potential of the base region. Another important consideration for thyristors used in such NDR devices is to ensure tight control over the conductance state of the thyristor.

These and other design considerations have presented challenges to implement such a thin capacitively-coupled thyristor in a variety of circuit implementations.

SUMMARY

The present invention is directed to overcoming the above-mentioned challenges and others related to the types of devices and applications discussed above and in other thyristor-based semiconductor applications, such as memory cells and embedded memory applications. The present invention is exemplified in a number of implementations and applications, some of which are summarized below.

According to an example embodiment of the present invention, a thyristor-based semiconductor device is manufactured having contiguously adjacent base and emitter regions having a junction therebetween, with a portion of the emitter region extending along and adjacent to the junction being lightly doped, relative to the adjacent base region. In connection with this example embodiment, it has been discovered that light doping results in decreased electric field between the base and emitter region. This decreased electric field has been found to be particularly useful in memory applications, wherein the thyristor is used for data storage. With this approach, such a thyristor-based semiconductor device can be implemented in a variety of applications, wherein tight control over the operation of the thyristor, and thus the storage of data, can be maintained.

In a more particular example embodiment of the present invention, a pass device is coupled in series to a second emitter region of the thyristor. A control port is arranged for capacitively coupling a signal to a second base region of the thyristor and for controlling current flow therein. A reference voltage line is coupled to the emitter region with a lightly-doped portion, and in response to signals (i.e., voltages) applied to the control port and the pass device, current flow in the thyristor, and thus the state of the second emitter region, is controlled. The controlled state of the second emitter region is used for storing data therein.

In another example embodiment of the present invention, a memory circuit arrangement includes an array of memory cells adapted for storing data. At least some of the memory cells include a thyristor having an emitter region with a relatively lightly-doped region, a pass device and control port as discussed above. The control ports of the cells and the pass devices are coupled to word lines adapted for applying the signals to the thyristors and pass devices for controlling data storage and manipulation at the thyristor.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
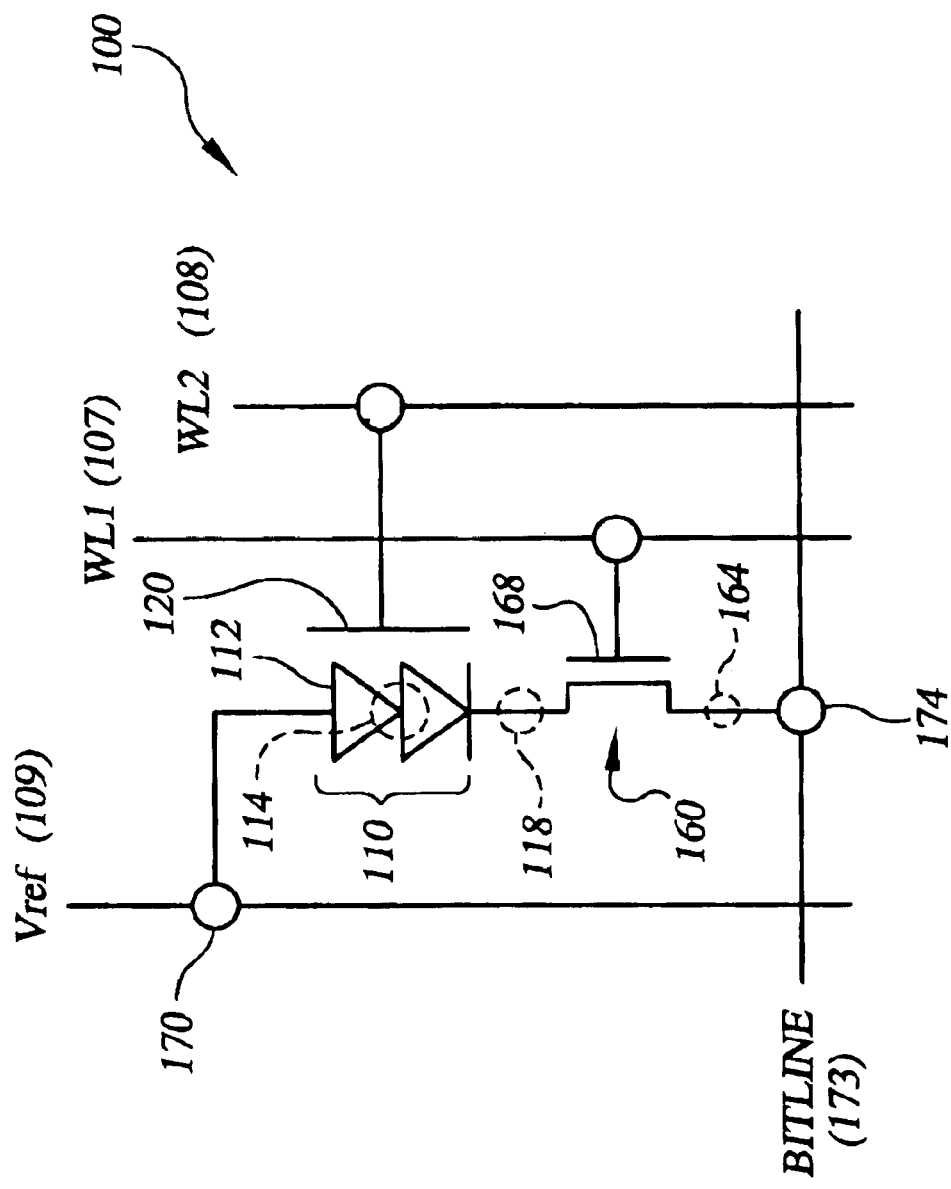
FIG. 1 is a circuit arrangement including a thyristor having a lightly-doped emitter region, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications benefiting from decreased emitter-base electric field. While the present invention is not necessarily limited to such applications, various aspects of the invention may be appreciated through a discussion of various examples using this context.

According to an example embodiment of the present invention, a portion of an emitter region of a thyristor (e.g., a thin capacitively-coupled thyristor) is doped to a concentration that is relatively lesser than the dopant concentration in an adjacent base region of the thyristor. The lightly-doped portion of the emitter region includes a portion that is contiguously adjacent to the adjacent base region, with a more heavily-doped portion of the emitter region being adapted for making contact to other circuitry, such as a reference voltage line. In connection with this example embodiment, it has been discovered that, using an emitter region with such lighter dopant concentration, the thyristor exhibits a relatively low Gummel number (e.g., relative to the total number of majority carriers per unit area in the base region). This arrangement is particularly useful in thyristor-based memory implementations, with the thyristor exhibiting electrical characteristics, such as an increased current density at the emitter, that are a function of the reduced Gummel number.

In one implementation, the base region has a dopant concentration that is significantly higher, e.g., about 10 times higher than the dopant concentration of the lightly-doped portion of the adjacent emitter region. A remainder of the adjacent emitter region has a higher dopant concentration (e.g., between about 4–5 times higher than the dopant concentration of the adjacent base region). This approach reduces the total number of majority carriers per unit area of the lightly-doped portion of the emitter region to a level below that of the base region, which effectively results in the reduced Gummel number. As discussed above, such a reduced Gummel number is useful for thyristor-based implementations, and by controlling the dopant concentration, the Gummel number can be tuned for the particular implementation to which the thyristor is to be applied. For instance, in another implementation, a thyristor is designed with a selected Gummel number, using a particular lower dopant concentration in an emitter region, and the design is subsequently implemented with a manufacturing process to achieve the designed dopant concentration. For general information regarding doping characteristics and approaches, and for specific information regarding doping approaches that can be implemented in connection with one or more example embodiments of the present invention, reference may be made to Kim, et al., "Electrical Characteristics of Npn-AlGaAs/GaAs HBTs with Modulated Base Doping Structures," Journal of the Korean Physical Society, Vol. 33, No. 5, November 1998, pp. 607–611, which is fully incorporated herein by reference.

In another implementation, a lightly-doped portion of an emitter region is disposed relative to a more heavily-doped portion of the emitter region and a heavily-doped adjacent base region such that the heavily doped base and emitter regions do not overlap. With this approach, the base region can be doped to a higher concentration than typically achievable without the use of such a lightly-doped emitter region, which has been found to be particularly useful in a variety of implementations. For instance, in a variety of processes such as high-performance deep sub-micron CMOS processes, relatively little heat is used. Processes employing such a limited thermal budget (heat) result in active dopant levels of device regions being limited by activation levels. If adjacent heavily-doped base and emitter regions were to overlap, the active doping level of the emitter region would desirably be much higher (e.g., 5 times or greater) than the doping level of the base region. This doping ratio ensures that the emitter will always be higher than the base region given various manufacturing variations that may exist. In some instances, however, optimal thyristor designs require a base doping level to be similar to the doping level of the emitter region (e.g., the doping levels are on the same order). In these instances, the lightly-doped emitter region is used as discussed above to separate the two heavily-doped adjacent base and emitter regions, such that they do not overlap. With this approach, an additional degree of freedom (the dopant level) is available for optimizing the Gummel number of a thyristor base region.

FIG. 1 shows a circuit arrangement 100 having a thyristor body 110 with a thyristor base region 114 adjacent to a thyristor emitter region 112 having a portion thereof with a relatively lesser dopant concentration than the base region 114, according to another example embodiment of the present invention. This particular arrangement decreases the capacitance between the base and emitter regions 114 and 112, relative to the capacitance that would exist, were the entire emitter region 112 doped to a higher concentration than the base region 114. In connection with this approach, it has been discovered that the Gummel number of the thyristor body 110 is lowered and that the circuit arrangement 100 exhibits properties that are particularly useful in memory implementations.

A pass device 160 is coupled in series with the thyristor body 110 and provides access to a storage node 118. Control port 120 and gate 168 are arranged for capacitively coupling signals to the thyristor body 110 and the pass device 160, respectively. The capacitively coupled signals control the state (current blocking and current passing) in which each of the devices exists, thereby controlling current flow in the thyristor body 110 and pass device 160. A relatively higher doped portion of the emitter region 112 is coupled to a reference voltage (Vref) line 109 via contact 170, and a source/drain region 164 of the pass device 160 is coupled to a bit line 173 via a bit line contact 174. First and second word lines 107 and 108 (WL1 and WL2) are coupled to the gate 168 and control port 120, respectively. In response to signals applied via WL1 107 and WL2 108, as well as to Vref line 109 and to bit line 173, data at storage node 118 is manipulated (e.g., for read and write access). For general information regarding data storage and manipulation with a thyristor-based device, such as the device 100, and for specific information regarding controlling current in a thyristor-based device with a capacitively-coupled control port, reference may be made to U.S. Pat. No. 6,229,161 (Nemati el al.).

Figure 2:
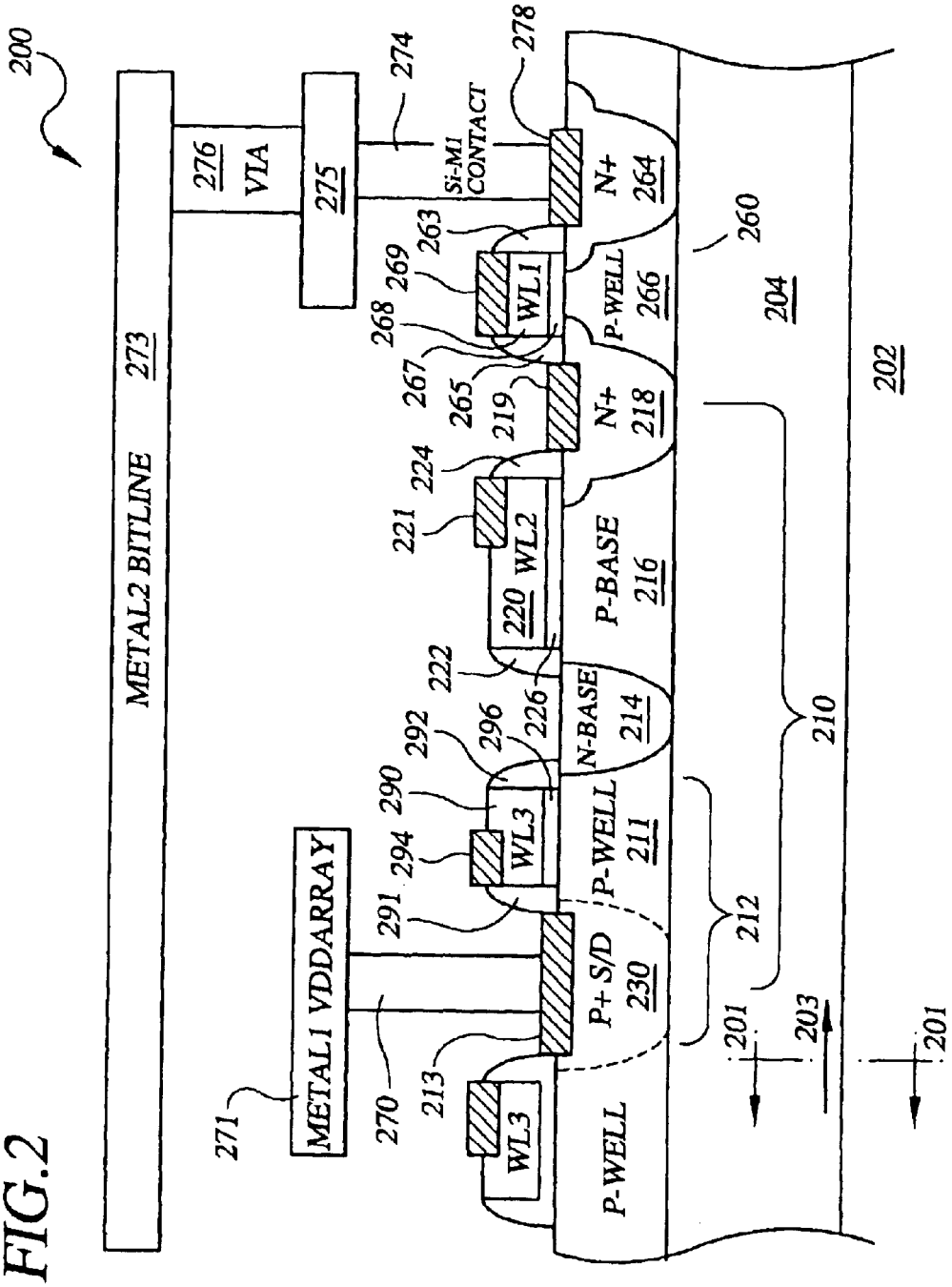
FIG. 2 is a semiconductor device having a lightly-doped emitter region (e.g., similar to the circuit arrangement in FIG. 1), according to another example embodiment of the present invention.

FIG. 2 is a thyristor-based semiconductor device 200 having a thyristor body region 210 with an anode emitter region 212 having a portion 211 thereof being lightly doped to a lesser dopant concentration than an adjacent N-base region 214, according to another example embodiment of the present invention. The anode emitter region 212 further includes a heavily-doped portion 230 having a P+ doping with a relatively higher dopant concentration than the lightly-doped portion 211, and in one implementation, having a P+ doping with a relatively higher dopant concentration than the dopant concentration of the N-base region 214. The lesser dopant concentration of the lightly-doped portion 211 reduces the Gummel number of the thyristor body 210, thereby increasing current density at the emitter region 212. Such increased current density is particularly useful, for example, in memory applications where data is stored at an N+ cathode emitter region 218, such as embedded memory applications.

The device 200 may, for example, be implemented in connection with the circuit arrangement 100 shown in FIG. 1 (e.g., wherein WL3 is inactive). The device 200 includes a first memory cell 203 separated from a mirrored memory cell 201 by P+ doped emitter portion 230, with discussion of articles of the mirrored memory cell 201 omitted for brevity. A substrate 202 has a buried insulator portion 204 over which the thyristor body region 210 and pass device 260 (implemented here as a transistor) are formed. Four contiguous thyristor regions including the emitter region 212, the N-base region 214, P-base region 216 and the N+ cathode emitter region 218 form the thyristor body 210. With this approach, adjacent circuits do not necessarily require insulative material, such as insulative portion 230 in FIG. 2, for electrically isolation.

In one implementation, the contiguous thyristor regions have relative dopant concentrations as follows. The N base region 214 has a dopant concentration that is about 10 times the dopant concentration of the P base region 216, with the lightly-doped portion 211 having a dopant concentration that is on the same order as the dopant concentration of the P base region 216. The P+ doped emitter portion 230 of the anode emitter 212 has a dopant concentration that is on the order of 4–5 times the dopant concentration of the N base region 214.

A thyristor control port 220 is over and separated from the P-base region 216 by a dielectric material 226, with insulative sidewall spacers 222 and 224 on opposing sides of the control port 220 and with a salicide region 221 on the control port 220. In one implementation, the control port 220 and the P-base region 216 are arranged such that a signal applied to the control port changes the potential across a majority of a cross-section of the P-base region 216.

The thyristor body 210 is coupled in series with the pass device 260 at the N+ emitter region 218, which is shared with the pass device 260 as a first source/drain region. The pass device further includes a second source/drain region 264, separated from the N+ emitter region 218 by a P-well region 266. A gate 268 is separated from the P-well region 266 by a dielectric material 267, with insulative sidewall spacers 265 and 263 on opposing sides of the gate 268 and with a salicide region 269 on the gate 268 for making electrical contact thereto.

The P+ doped emitter portion 230 is coupled to a first metal layer 271 via a salicide region 213 and a contact 270, and to a bit line 273 via a bit line contact 274, first metal layer portion 275 and a via 276. In addition, first and second word lines are electrically coupled to the gate 268 and control port 220 via salicided portions 269 and 221, respectively (e.g., the first and second word lines may include the gate 268 and the control port 220). A third word line 290 is disposed on a dielectric material 296 over the lightly-doped portion 211 of the emitter 212. Sidewall spacers 291 and 292 are disposed on opposite sides of the third word line 290, and a salicide portion 294 is disposed on an upper surface of the third word line.

The salicide region 221, as well as other selected salicide regions shown in FIG. 2 and the other figures as described below, are shown optionally formed over only a portion of the structures (e.g., control ports) in which they are formed. With this approach, shorting between various regions (e.g., between the contact 270 and the N base region 214) can be avoided when process misalignment occurs.

In one implementation, the third word line 290 is active, such that it is adapted for changing the potential across at least a portion of the lightly-doped portion 211 of the emitter 212. In another implementation, the third word line 290 is inactive and adapted for masking the P-well region 212 during manufacture, to prevent dopants from being implanted therein (e.g., during implant of the P+ emitter portion 230). In this latter implementation, the third word line 290 is optionally removed after being used to mask the lightly-doped portion 211.

The thyristor 210 is arranged such that the control port 220 capacitively couples a signal to the P-base region 216 for controlling current flow in the thyristor 210 between the emitter regions 212 and 218 in response to a voltage applied to the second word line. The pass device 260 is similarly arranged such that the gate 268 capacitively couples a signal to the P-well region 266 in response a voltage being applied to the first word line, for controlling current flow between the source/drain regions 218 and 264.

Various ones of the example embodiments described below in connection with the figures share similar features with each other and with FIGS. 1 and 2. In each of these Figures, certain discussion of similar features that are similarly numbered is omitted for brevity. In addition, as with mirrored portion 201 in FIG. 2, discussion of mirrored and/or repeated structures is likewise omitted.

Figure 3:
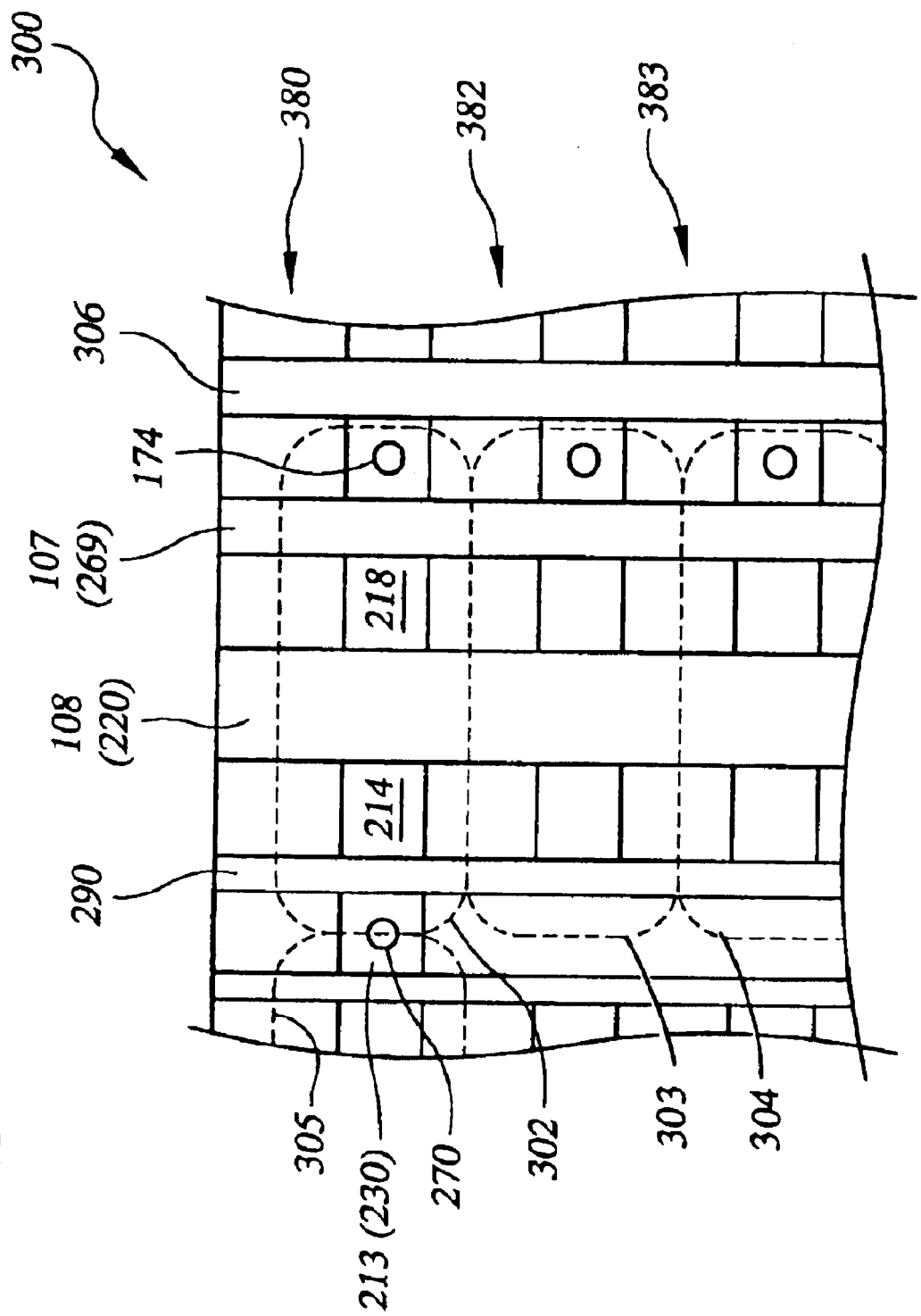
FIG. 3 is a memory array including the semiconductor device of FIG. 2, according to another example embodiment of the present invention.

FIG. 3 is a top-down view of a memory array 300 including the device 200 in FIG. 2 implemented in cell 302, according to another example embodiment of the present invention. Cell 302 has selected shown articles labeled, with the description thereof also being applicable to cells 303–305. Referring to FIGS. 1 and 2 for reference, a Vref line (e.g., Vref line 109) is electrically coupled to the salicide portion 213 of the P+ anode portion 230 (below the salicide 213) via a contact 270. Second word line 108 is arranged to capacitively couple a signal to P-base regions for each thyristor in cells 302–304. Similarly, first word line 107 is arranged to capacitively couple signals to P-well regions in each pass device in cells 302–304. A third word line 290 is disposed over a P-well region 212 (under the third word line), as shown in FIG. 2. Bit lines (not shown) may, for example, extend horizontally in parallel with each cell 302–304, with the bit line for cell 302 being electrically coupled to bit line contact 174 of cell 302 and similarly coupled to a bit line contact (not shown) for cell 305. Each cell is electrically isolated from adjacent cells in a common column by shallow trench isolation regions 380, 382 and 383, and share the salicided region 213 having a common Vref contact.

Figure 4:
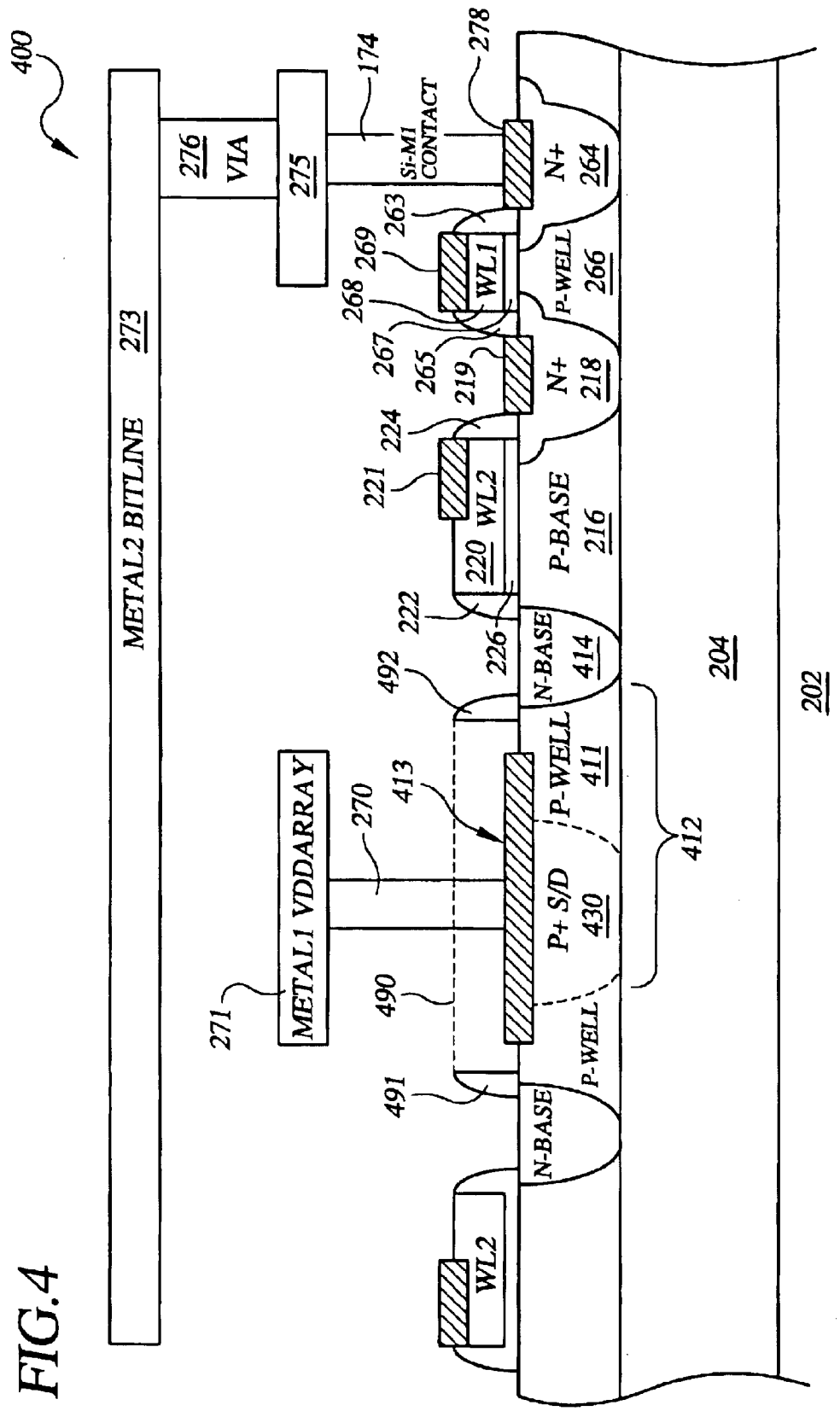
FIG. 4 is another semiconductor device having a lightly-doped emitter region, according to another example embodiment of the present invention.

FIG. 4 is another thyristor-based semiconductor device 400, similar to the device 200 shown in FIG. 2, but formed using a third word line 490, which has been subsequently removed, as a mask during implant of an N-base region 414, according to another example embodiment of the present invention. Essentially, the third word line 490 is formed over a lightly-doped portion 411 of an emitter region 412 with sidewall spacers 491 and 492 on opposing sidewalls thereof. The combination of the third word line 490 and sidewall spacers 491 and 492 are used as a mask during an N-base implant to form N-base region 414 (as well as a mirrored N-base region adjacent to sidewall spacer 491). After the N-base implant, the third word line is removed (e.g., via etching) and a P+ implant is used to form a P+ doped emitter portion 430. A salicide material 413 is formed on the P+ doped emitter portion 430, wherein electrical contact is made to the portion 271 of the first metal layer via Vref line 270.

Figure 5A:
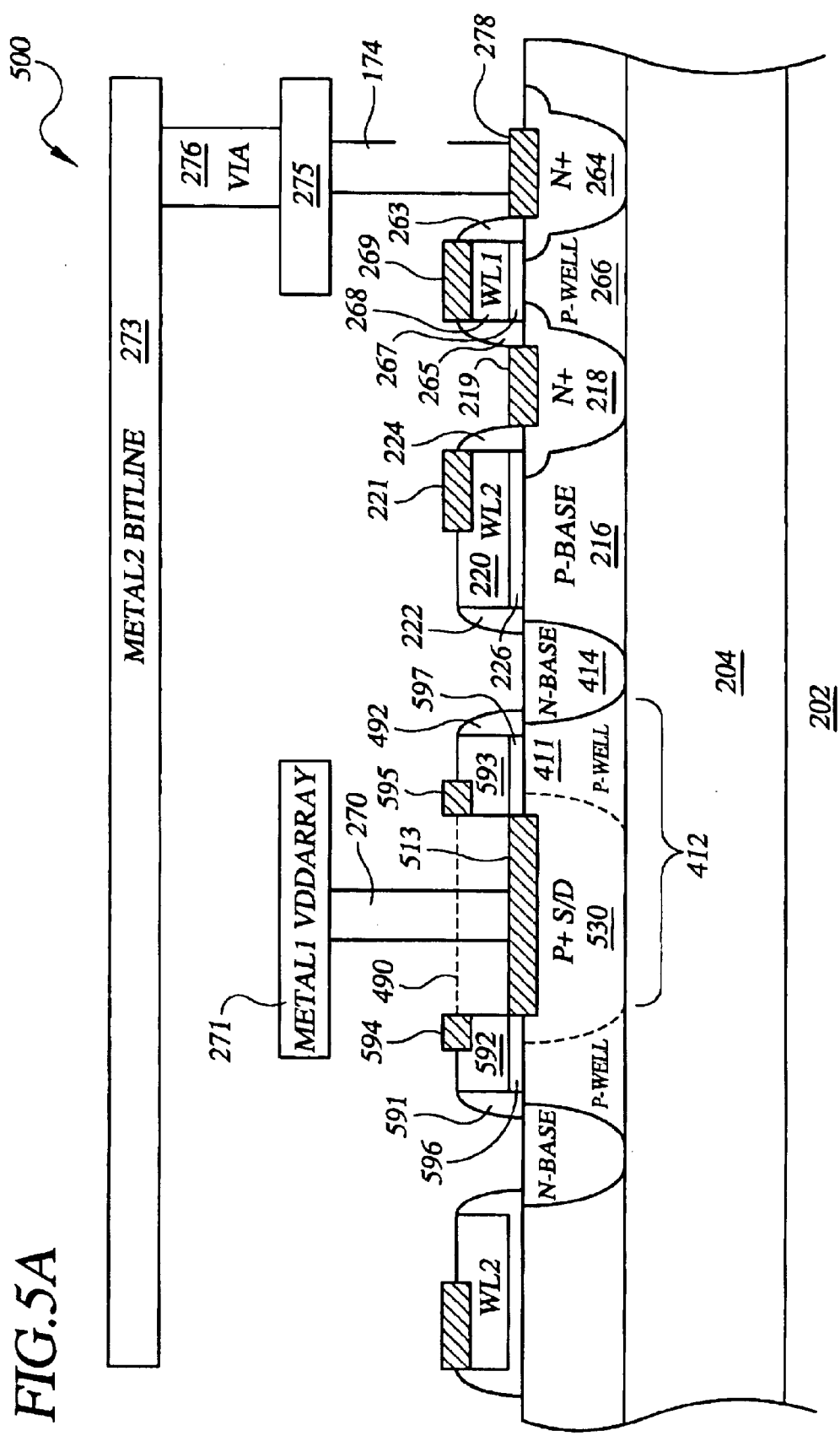
FIG. 5A is another semiconductor device having a lightly-doped emitter region, according to another example embodiment of the present invention.

FIG. 5A shows another thyristor-based semiconductor device 500, similar to the device 400 shown in FIG. 4, formed using a third word line 490 as a mask and with a portion thereof having been removed (shown with dashed lines), according to another example embodiment of the present invention. In this example embodiment, portions 592 and 593 of the third word line 490, formed over gate dielectric material portions 596 and 597, respectively, mask the implant of a P+ doped emitter portion 530, which is separated from N-base region 414 by a lightly-doped emitter portion 411. As with the device 400 in FIG. 4, the lightly-doped emitter portion 411 is doped to a lesser dopant concentration than the N-base region 414. Salicide material portions 513, 594 and 595 are formed on the P+ source/drain region 530 and on third word line portions 592 and 593, respectively.

Figure 5B:
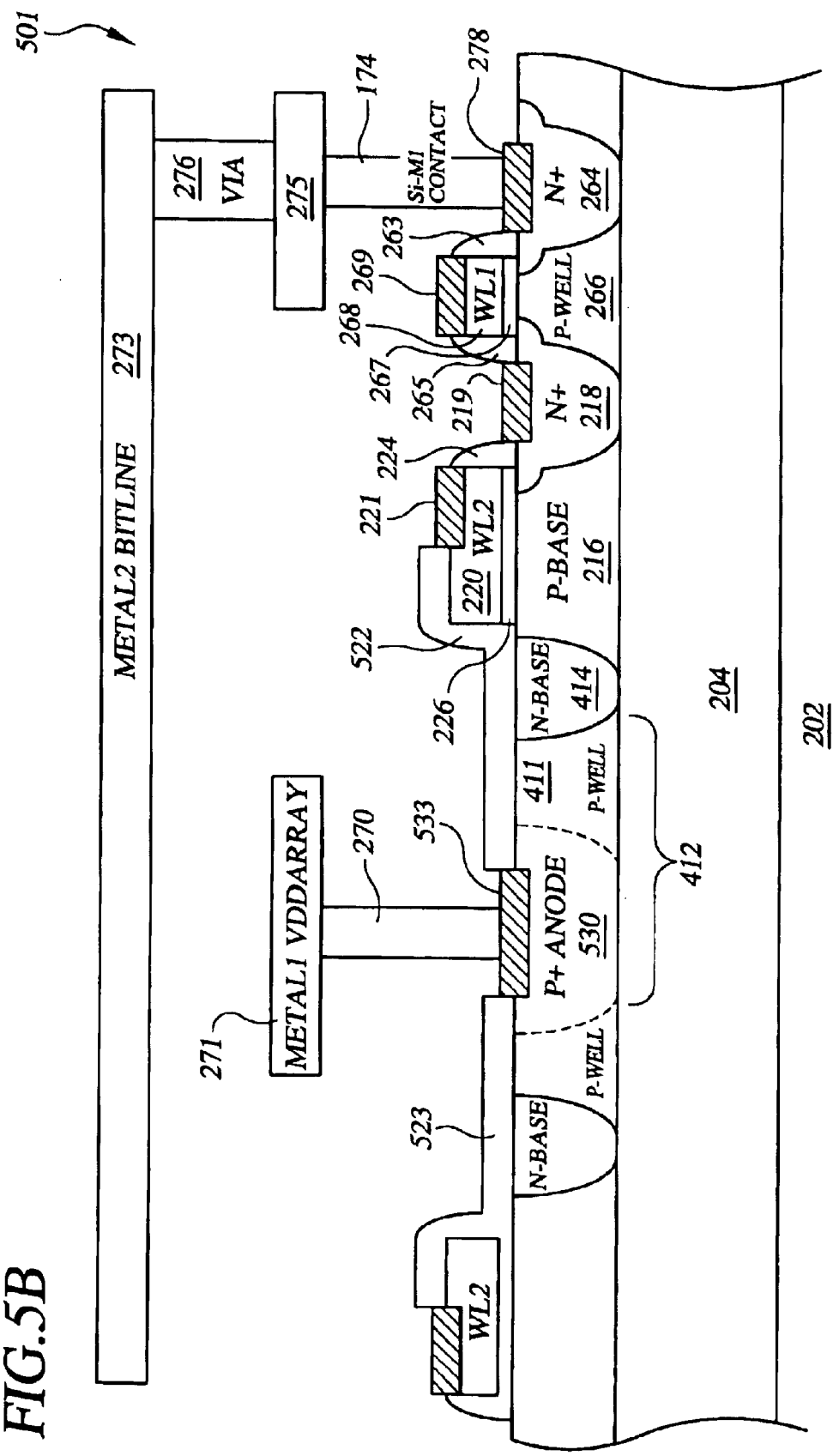
FIG. 5B is another semiconductor device having a lightly-doped emitter region, similar to FIG. 5A but not having a third word line, according to another example embodiment of the present invention.

FIG. 5B shows a thyristor-based semiconductor device 501, similar to the device 500 shown in FIG. 5A, and without the third word line 490, according to another example embodiment of the present invention. In this example embodiment, the P+ anode 530 implant is effected using a mask to prevent the lightly-doped region 411 from being implanted. Spacer/insulating material 522 and 523 is formed over the device 501 after the P+ doped emitter portion 530 is formed, or, in one implementation, before the P+ doped emitter portion 530 is formed, wherein the spacer/insulating material 522 and 523 is used as a mask. A region 533 over the P+ doped emitter portion 530 is salicided, to which contact is made via contact 270 as discussed above.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein Such changes may include, but are not necessarily limited to: altering the dopant concentration in the thyristor body regions, adjusting the relative amount of heavily and lightly doped emitter portions, altering the shapes, locations, and sizes of the illustrated thyristors and conductors; adding structures to the integrated circuit device; increasing the number of PN body sections in the thyristor, and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161 (discovered above), which is fully incorporated herein by reference. Such modifications and changes do not depart from the true spirit and scope of the present invention that is set forth in the following claims.

What is claimed is:

1. A method for manufacturing a thyristor-base semiconductor device, the method comprising:

forming a thyristor having a body region in a substrate with a plurality of laterally contiguous regions of opposite polarity including a first base region coupled to a first emitter region via a junction and a second base region coupled to a second emitter region, the first and second base regions being coupled to one another, wherein the first emitter region is formed by doping a lightly-doped portion with a significantly lighter dopant concentration than the dopant concentration of the first base region and the lightly-doped portion extending along and adjacent to the junction; and forming a thyristor control port configured and arranged for capacitively coupling at least to the second base region for controlling current flow in the thyristor body region.

2. The method of claim 1, further comprising forming a mask over the lightly-doped portion, wherein doping the heavily-doped portion includes using the mask to mask the lightly-doped portion.

3. The method of claim 2, wherein forming the mask includes forming a word line to mask the lightly-doped portion.

4. The method of claim 1, wherein forming a thyristor control port includes forming a word line having a spacer on a sidewall thereof, wherein forming the thyristor includes using the spacer to mask a portion of the substrate during doping of the first base region.

5. The method of claim 4, wherein forming the thyristor includes using an angled implant to form the first base region.

6. The method of claim 1, wherein forming a heavily-doped portion of the emitter region includes doping the heavily-doped portion with a significantly higher dopant concentration than the dopant concentration of the first base region.

7. The method of claim 1, wherein forming a thyristor includes doping the heavily-doped portion of the first emitter region and the first base region to a similar dopant concentration.

8. The method of claim 7, further comprising using the lightly-doped portion of the first emitter region to prevent overlap of the heavily-doped portion of the first emitter region and the first base region.

* * * * *